(12) United States Patent
Basceri et al.

(10) Patent No.: US 7,253,102 B2
(45) Date of Patent: *Aug. 7, 2007

(54) METHODS FOR FORMING AND INTEGRATED CIRCUIT STRUCTURES CONTAINING ENHANCED-SURFACE-AREA CONDUCTIVE LAYERS

(75) Inventors: Cem Basceri, Boise, ID (US); Mark Visokay, Richardson, TX (US); Thomas M. Graettinger, Boise, ID (US); Steven D. Cummings, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 142 days.

This patent is subject to a terminal disclaimer.

(21) Appl. No.: 10/860,341

(22) Filed: Jun. 2, 2004

(65) Prior Publication Data

US 2004/0217409 A1   Nov. 4, 2004

Related U.S. Application Data

(60) Division of application No. 10/196,535, filed on Jul. 15, 2002, now Pat. No. 6,764,943, which is a continuation of application No. 09/590,791, filed on Jun. 8, 2000, now Pat. No. 6,482,736.

(51) Int. Cl.
*H01L 21/4763* (2006.01)
*H01L 21/44* (2006.01)

(52) U.S. Cl. ............... 438/650; 438/686; 257/E21.009; 257/E21.012

(58) Field of Classification Search ................ 438/650, 438/686, 381
See application file for complete search history.

(56) References Cited

U.S. PATENT DOCUMENTS

| | | |
|---|---|---|
| 5,068,199 A | 11/1991 | Sandhu |
| 5,130,885 A | 7/1992 | Fazan et al. |
| 5,318,920 A | 6/1994 | Hayashide |
| 5,342,800 A | 8/1994 | Jun |
| 5,372,962 A | 12/1994 | Hirota et al. |
| 5,427,974 A | 6/1995 | Lur et al. |
| RE35,420 E | 1/1997 | Cathey et al. |
| 5,608,247 A | 3/1997 | Brown |
| 5,612,560 A | 3/1997 | Chivukula et al. |
| 5,696,014 A | 12/1997 | Figura |
| 5,786,259 A | 7/1998 | Kang |
| 5,811,344 A | 9/1998 | Tu et al. |
| 5,834,357 A | 11/1998 | Kang |
| 5,877,063 A | 3/1999 | Gilchrist |
| 5,926,360 A * | 7/1999 | Laibowitz et al. ........ 361/321.4 |
| 5,959,327 A | 9/1999 | Sandhu et al. |
| 5,962,065 A | 10/1999 | Weimer et al. |
| 5,982,609 A | 11/1999 | Evans |
| 5,985,714 A | 11/1999 | Sandhu et al. |
| 6,015,743 A | 1/2000 | Zahurak et al. |
| 6,037,220 A | 3/2000 | Chien et al. |
| 6,049,101 A | 4/2000 | Graettinger et al. |
| 6,060,351 A | 5/2000 | Parekh et al. |
| 6,060,367 A | 5/2000 | Sze |
| 6,107,136 A | 8/2000 | Melnick et al. |
| 6,188,097 B1 | 2/2001 | Derderian et al. |
| 6,458,651 B2 * | 10/2002 | Rhodes ...................... 438/253 |
| 6,482,736 B1 * | 11/2002 | Basceri et al. .............. 438/650 |

OTHER PUBLICATIONS

Kawahara, Takaaki et al., "(Ba, Sr) TiO₃ Films Prepared by Liquid Source Chemical Vapor Deposition on Ru Electrodes," *Jpn. J. Appl. Phys.*, 35:4880-4885 (1996).

Murakami, Y., et al. "Porous ruthenium oxide electrode prepared by adding lanthanum chloride to the coating solution," *Journal of Alloys and Compounds*, 261:176-181 (1997).

* cited by examiner

*Primary Examiner*—Alexander Ghyka

(74) *Attorney, Agent, or Firm*—Williams, Morgan & Amerson, P.C.

(57) ABSTRACT

An enhanced-surface-area conductive layer compatible with high-dielectric constant materials is created by forming a film or layer having at least two phases, at least one of which is electrically conductive. The film may be formed in any convenient manner, such as by chemical vapor deposition techniques, which may be followed by an anneal to better define and/or crystallize the at least two phases. The film may be formed over an underlying conductive layer. At least one of the at least two phases is selectively removed from the film, such as by an etch process that preferentially etches at least one of the at least two phases so as to leave at least a portion of the electrically conductive phase. Ruthenium and ruthenium oxide, both conductive, may be used for the two or more phases. Iridium and its oxide, rhodium and its oxide, and platinum and platinum-rhodium may also be used. A wet etchant comprising ceric ammonium nitrate and acetic acid may be used. In the case of this etchant and a ruthenium/ruthenium oxide film, the etchant preferentially removes the ruthenium phase, leaving a pitted or "islanded" surface of ruthenium oxide physically and electrically connected by the underlying conductive layer. The remaining pitted or islanded layer, together with the underlying conductive layer, if any, constitutes an enhanced-surface-area conductive layer. The enhanced-surface-area conductive layer may be used to form a plate of a storage capacitor in an integrated circuit, such as in a memory cell of a DRAM or the like.

13 Claims, 3 Drawing Sheets

METHODS FOR FORMING AND INTEGRATED CIRCUIT STRUCTURES CONTAINING ENHANCED-SURFACE-AREA CONDUCTIVE LAYERS

This is a division of application Ser. No. 10/196,535, filed Jul. 15, 2002, now U.S. Pat. No. 6,764,943 which is a continuation of application Ser. No. 09/590,791, filed Jun. 8, 2000, now U.S. Pat. No. 6,482,736 both of which are incorporated herein by reference.

FIELD OF THE INVENTION

This invention relates to semiconductor devices and the fabrication thereof, and particularly to ruthenium-containing conductive layers and the formation and use thereof.

BACKGROUND OF THE INVENTION

A capacitor generally includes two electrical conductors in close proximity to, but separated from, each other. The two conductors form the "plates" of the capacitor, and may be separated by a dielectric material. When a voltage is applied across the plates of a capacitor, electrical charge accumulates on the plates. If the plates are electrically isolated essentially immediately after a voltage is applied, the accumulated charge may be stored on the plates, thus "storing" the applied voltage difference.

The fabrication of integrated circuits involves the formation of conductive layers for use as various circuit components, including for use as capacitor plates. Memory circuits, such as DRAMs the like, use conductive layers to form the opposing plates of storage cell capacitors.

The drive for higher-performance, lower-cost integrated circuits dictates ever-decreasing area for individual circuit features, including storage capacitors. Since capacitance of a capacitor (the amount of charge that can be stored as a function of applied voltage) generally varies with the area of capacitor plates, as the circuit area occupied by the storage capacitor decreases, it is desirable to take steps to preserve or increase capacitance despite the smaller occupied area, so that circuit function is not compromised.

Various steps may be taken to increase or preserve capacitance without increasing the occupied area. For example, material(s) having higher dielectric constant may be used between the capacitor plates. Further, the plate surfaces may be roughened to increase the effective surface area of the plates without increasing the area occupied by he capacitor.

One method for providing a roughened surface for a plate of a storage cell capacitor is to form the plate of hemispherical grain polysilicon (HSG), possibly with an overlying metal layer. The hemispherical grains of HSG enhance the surface area of the plate without increasing its occupied area.

HSG presents difficulties in fabrication, however, because of the formation of silicon dioxide on and near the HSG. A silicon dioxide layer may form on the HSG, particularly during deposition of the capacitor's dielectric layer. Even with an intervening metal layer present, oxygen from the deposition of the dielectric layer can diffuse through the metal layer, forming silicon dioxide at the polysilicon surface. Silicon diffusion through the metal layer may also produce a silicon dioxide layer between the metal and the dielectric layers.

Silicon dioxide between the metal layer and the HSG can degrade the electrical contact to the metal capacitor plate surface. Silicon dioxide between the metal layer and the dielectric layer can decrease the capacitance of the resulting capacitor.

To attempt to avoid these negative effects caused by formation of silicon dioxide, a diffusion barrier layer may be employed between the HSG and the metal layer. But in the typical capacitor geometry, the greater the total number of layers, the larger the required minimum area occupied by the capacitor. Further, the upper surface of each additional layer deposited over the HSG tends to be smoother than the underlying surface, reducing the increased surface area provided by the HSG.

SUMMARY

The present invention provides an enhanced-surface-area (rough-surfaced) conductive layer compatible with high-dielectric constant materials and useful in the formation of integrated circuits, particularly for plates of storage capacitors in memory cells.

The enhanced-surface-area conductive layer may be formed by first forming a film having two or more phases, such as iridium and iridium oxide phases, ruthenium and ruthenium oxide phases, rhodium and rhodium oxide phases, platinum and platinum-rhodium phases, and the like. The film may be formed over an underlying conductive layer. At least one of the phases in the film is then selectively removed from the film, leaving at least one of the phases behind to form an enhanced-surface-area conductive layer.

In an illustrated embodiment, a phase of a layer is removed to leave a pitted surface of a non-removed phase. The pitted surface may include islands formed of the non-removed phase. An "islanded" surface may also be formed by the differential removal, the surface of which may include some pits. Any suitable selective removal process may be employed, such as an etch process or etchant, wet or dry, that etches one phase at a much greater rate than an other phase. Thermal and electrochemical selective removal techniques may also be employed. The selective removal process preferentially removes the one phase, leaving a pitted or "islanded" surface of the other phase. In the case of an islanded surface having separate or isolated islands, an underlying conductive layer may physically and electrically connect the islands. The layer of remaining pitted or islanded material, together with the underlying conductive layer, if any, constitutes an enhanced-surface-area electrically conductive layer.

The enhanced-surface-area conductive layer may be used to form a plate of a storage capacitor in an integrated circuit, such as in a memory cell of a DRAM or the like. If the material chosen to form the enhanced-surface-area conductive layer is relatively resistant to oxidation-induced decreases in conductivity, such as with ruthenium oxide or other oxygen-containing conductors, for example, then the tendency toward silicon dioxide formation may be reduced or eliminated, providing improved compatibility for use with high-dielectric-constant dielectric materials. An intervening metal layer and/or barrier such as used in the HSG approach may also be used, but is desirably omitted from the capacitor structure, allowing smaller dimensions for capacitors with the same or even greater capacitance. This allows the design and fabrication of higher speed, higher density, and lower cost memory circuits.

DETAILED DESCRIPTION

The present invention allows the creation of a surface-area-enhanced conductive layer that has improved compatibility with high-dielectric-constant ("high-κ") dielectric materials.

This is achieved by forming a layer of material having at least two phases, at least one of phase of which is a conductive material. The layer may be formed over an underlying conductive layer. The layer may have two or more phases in an as-deposited state. The layer may also be treated in physical and/or chemical environments, after or during deposition, which environments enhance, control, or influence the development of zones of different phases within the layer.

After the layer having at least two phases is formed, at least one of the phases is selectively removed, leaving at least one of the phases of a conductive material behind. The remaining conductive phase or phases form, together with the underlying conductive layer, if any, an enhanced-surface area conductive layer which may be used to form a plate of a storage capacitor in an integrated circuit, such as in a memory cell of a DRAM or the like. If the material chosen to form the enhanced-surface-area conductive layer is relatively resistant to oxidation-induced decreases in conductivity, as with an oxygen-containing conductor such as ruthenium oxide, for example, then the tendency toward silicon dioxide formation may be reduced or eliminated, providing improved compatibility for use with high-dielectric-constant dielectric materials.

EXAMPLE EMBODIMENTS

In accordance with a specific embodiment of the present invention, a surface-area-enhanced conductive layer may be created by differentially removing ruthenium relative to ruthenium oxide from a film or layer containing both ruthenium (Ru) and ruthenium oxide ($RuO_2$) phases. The differential removal process, in this example, may involve the preferential removal of ruthenium relative to ruthenium oxide in the layer. For example, the removal may be performed with an etchant and/or etch process that preferentially etches ruthenium relative to ruthenium oxide, leaving an enhanced-surface area layer comprising ruthenium oxide.

Figure 1:
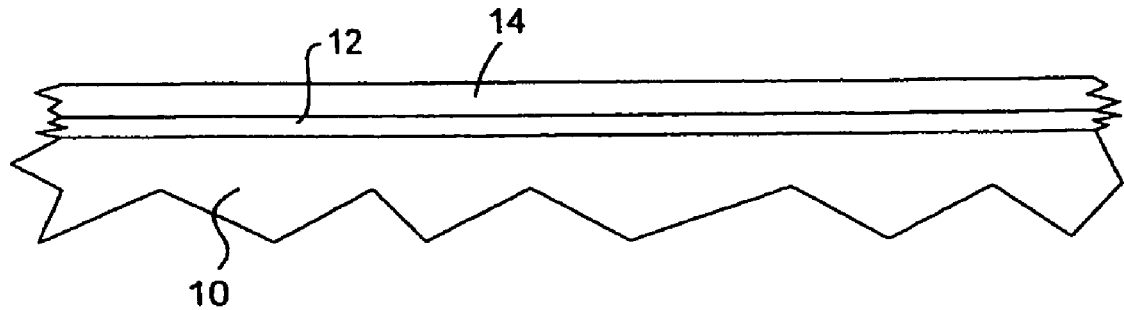
FIG. 1 is a cross-section of a structure with layers used in an example of a process according to one embodiment of the present invention.

The surface-area-enhanced conductive layer may be formed on a supporting structure 10 shown in partial cross-section in FIG. 1. The supporting structure may be any structure present in or on an integrated circuit during the fabrication thereof, but is typically a conductive material that will be in electrical contact with a capacitor plate formed by the surface-area-enhanced conductive layer.

An underlying electrically conductive layer 12 may be formed or deposited first onto the structure 10, such as by chemical vapor deposition (CVD), sputtering, or another suitable process. The layer 12 is typically of a thickness at least sufficient to maintain continuity of the layer 12, such as at least about 100 Angstroms. The layer 12 may be formed of any suitable electrically conductive material, but is desirably formed of ruthenium oxide.

Figure 2:
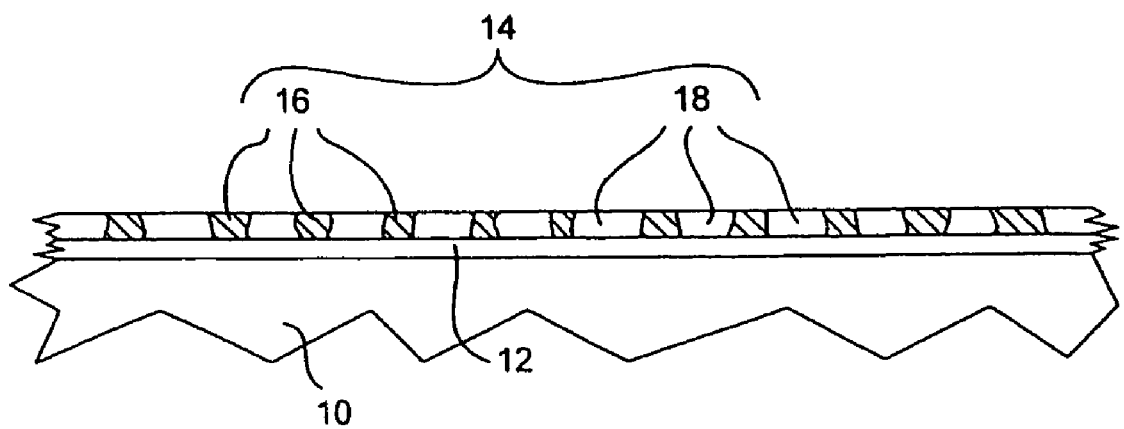
FIG. 2 is a cross-section of the layers of FIG. 1 after separation or crystallization of separate phases within one of the layers.

An oxygen-deficient non-stoichiometric ruthenium oxide ($RuO_x$) layer 14 may then be deposited or formed, also by CVD, sputtering, or any other suitable process. In representative examples, the thickness of the resulting $RuO_x$ layer 14 is between about 1 Angstrom and 500 Angstroms. The RuOx layer 14 may then be annealed to facilitate crystallization of a ruthenium phase and a ruthenium oxide ($RuO_2$) phase and/or a non-stoichiometric ruthenium oxide ($RuO_x$) phase within the layer 14. Annealing may be accomplished, for example, by rapid thermal anneal (RTA) in non-oxidizing ambients, such as nitrogen, ammonia, helium, argon, or by other suitable annealing processes, to produce both zones 18 of ruthenium (Ru) and zones 16 of ruthenium oxide ($RuO_2$ and/or $RuO_x$) within the layer 14, as shown in FIG. 2. The gas ratios of the ruthenium and oxygen source gases during deposition of the layer 14 may be selected to create a desired ratio between the amounts of the respective phases present in the layer 14. The deposition conditions and the RTA time, temperature, and pressure may be selected to provide a desired mean size for the ruthenium zones. The ruthenium zones 18, for example, desirably extend completely through the thickness of the layer 14, as shown, and desirably have a mean diameter of about one to three times the thickness of the layer 14 most desirably about two times the thickness of the layer 14, or about 400 Angstroms for a 200-Angstrom layer 14.

The layer 14 having both ruthenium zones 18 and ruthenium oxide zones 16 may then be processed to differentially remove the ruthenium phase relative to the ruthenium oxide phase, and desirably relative to the underlying conductive layer 12. In the illustrated embodiment, ruthenium is preferentially removed relative to ruthenium oxide. A wet etch process is one suitable approach for differentially removing ruthenium. As a specific example, a wet etchant comprising ceric ammonium nitrate and acetic acid may be used. Other processes that remove ruthenium preferentially over ruthenium oxide may also be used. As additional examples, etching using ozonated water or selective dry etch processes may also be employed.

Figure 3:
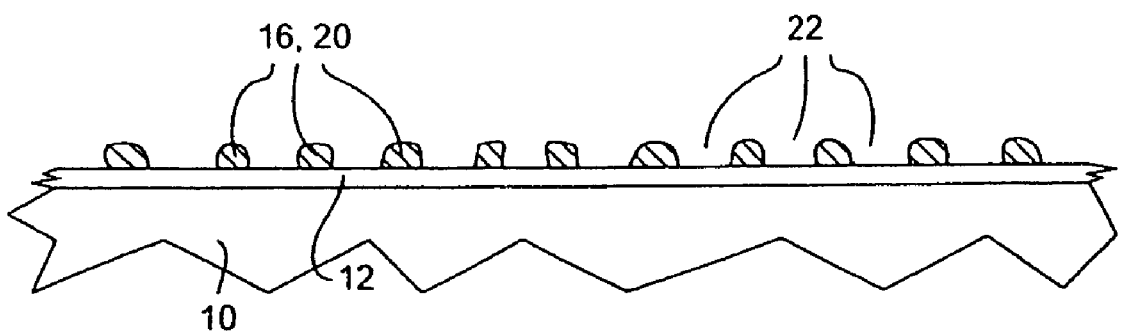
FIG. 3 is a cross-section of the layers of FIG. 2 after preferential removal of one of the phases.

In the illustrated embodiment, the wet etch process may be controlled so as to essentially remove the ruthenium phase from the layer 14, or at least to remove those zones of ruthenium that are exposed to the etch. In the case of ruthenium zones extending completely through the layer 14, essentially all of the ruthenium phase may be removed from the layer 14, as shown in FIG. 3, leaving the ruthenium oxide zones 16.

Depending on the ratio of ruthenium phase to ruthenium oxide phase in the layer 14, the remaining ruthenium oxide zones 16 may be in the form of a layer with pits or depressions therein, or in the form of islands or nodules 20 separated by an open web 22, or a combination of pits extending partially or entirely through the layer 14 and islands. In other words, the layer 14, following anneal, may comprise a relatively even mixture of ruthenium oxide and ruthenium phases, or it may be zones of ruthenium phase in a ruthenium oxide matrix, or zones of ruthenium oxide phase in a ruthenium matrix, depending on the composition of the pre-annealed layer, and on the anneal conditions. When the layer 14 is subsequently etched in the illustrated example, the enhanced surface-area structure results.

For a capacitor plate, generally no areas of the plate should be electrically isolated. The underlying conductive layer 12 thus serves to electrically connect all of the remaining ruthenium oxide zones 16, particularly if they are in the form of physically separated islands.

Where the remaining ruthenium oxide is the form of islands, the mean distance between nearest edges of such islands is desirably between about three to four times a thickness of a dielectric layer that conformally covers the layer 14, For example, for a capacitor that includes a 60 Angstrom thick tantalum oxide layer, the mean distance between the nearest edges of such islands is preferably is in the range of 180-240 Angstroms. Where the remaining ruthenium oxide includes pits, the pits have a mean diameter of one to three times the thickness of the layer 14 and have a mean closest distance that is at least two times the thickness of the layer 14.

Figure 4:
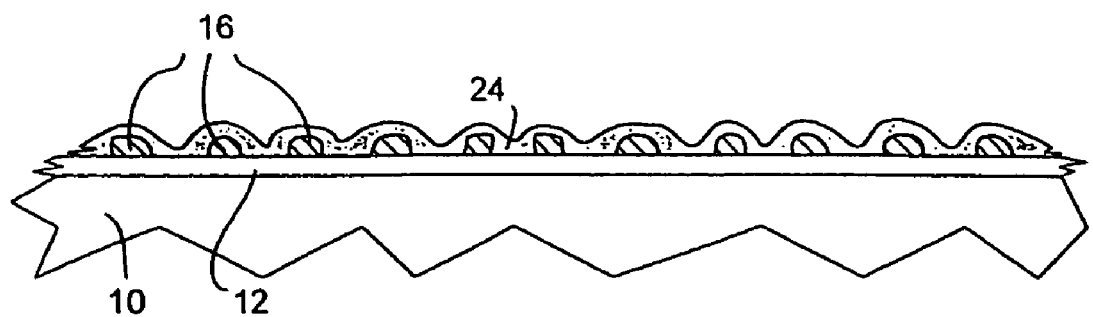
FIG. 4 is a cross section of the layers of FIG. 3 after formation of a dielectric layer on the structure.

The remaining ruthenium oxide zones 16 shown in FIG. 3 constitute, together with the underlying conductive layer 12, an enhanced-surface-area conductive layer compatible with high-dielectric-constant dielectric materials. To form a capacitor with the enhanced-surface-area conductive layer of FIG. 3, a layer 24 of a dielectric material is provided on the structure. The layer 24 may be of a high-dielectric-constant dielectric material, generally any dielectric with a dielectric constant of at least 9, or more preferably, a dielectric constant of at least 20, with tantalum pentoxide ($Ta_2O_5$) being a specific example. The dielectric material may be formed conformally over the enhanced-surface-area conductive layer, as shown in FIG. 4. Other high-constant dielectrics may also be employed, such as barium strontium titanium oxide, lead zirconium titanium oxide, and strontium bismuth tantalum oxide, for example. Because of the relatively large diameter of the previously removed ruthenium phase zones, the layer 24 can conform somewhat to the shape of the enhanced-surface-area conductive layer, allowing an enhanced surface area on both sides of the layer 24. In other words, the surface of the layer 24 away from the remaining ruthenium oxide zones is desirably not flat, but follows at least somewhat the contours of the underlying ruthenium oxide, providing an enhanced surface area on this surface as well.

Figure 5:
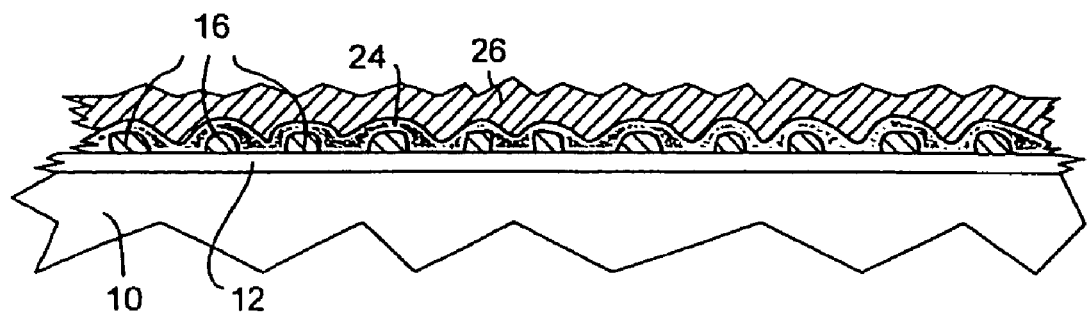
FIG. 5 is a cross section of the layers of FIG. 4 after deposition of a conductive layer on the structure.

A conductive layer 26 may then be formed or deposited conformally over the dielectric layer 24, as shown in FIG. 5. The surface of layer 26 uppermost in the figure is not shown because the layer may generally be of any thickness sufficiently thick to insure continuity of the layer and sufficiently thin to fit within the overall volume allotted to the capacitor. As shown in FIG. 5, the surface of layer 26 next to the dielectric layer 24 may conform to the enhanced surface area of the dielectric layer 24, providing an enhanced surface area for the conductive layer 26 as well. The two conductive layers, one formed by layer 12 and zones 16, and one formed by layer 26, form the two plates of a capacitor. Both plates may have enhanced surface area relative to the area occupied by the capacitor. The possible omission of an intermediate metal layer and/or barrier layer above the lower plate allows for increased plate surface area and decreased overall thickness of the capacitor structure.

Figure 6:
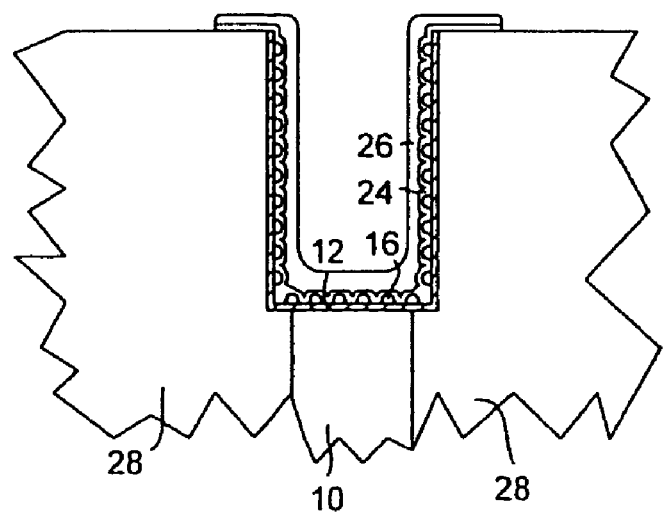
FIG. 6 is a cross-section of a container capacitor structure produced by a process of the present invention and included in an integrated circuit.

Application of the plate structure shown in FIG. 5 to a capacitor of an integrated circuit—a container capacitor in this example—is illustrated in the cross-section of FIG. 6. The supporting structure 10 in this example is a conductive plug of polysilicon or other conductive material formed at the bottom of an opening in a dielectric material 28 such as borophosphosilica glass (BPSG). The plug contacts a circuit element such as a transistor gate (not shown). At the sides of the cylindrical container, the BPSG itself functions a supporting structure for the capacitor plate structure. The thinness of the capacitor structure provided by the layer structure of FIG. 5 maximizes the capacitor plate surface area in the container capacitor of FIG. 6, particularly for the inner (upper) electrode, the surface area of which decreases with increasing thickness of the layer structure. The enhanced-surface-area layers also increase the effective surface area beyond that of the occupied area. The use of the enhanced-surface-area ruthenium oxide conductive layer thus provides improved capacitance in a given area.

Figure 7:
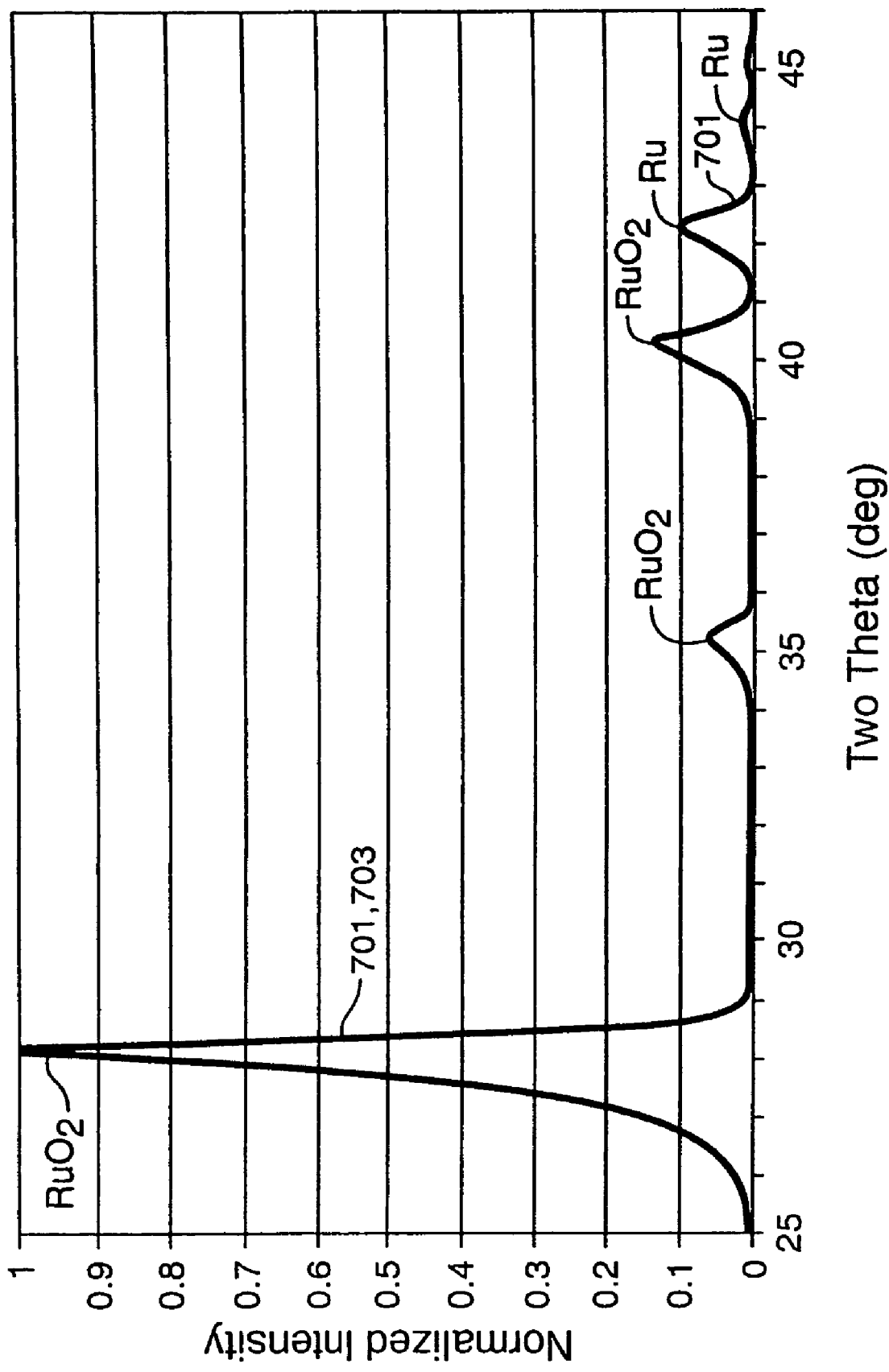
FIG. 7 is a computer generated plot of an X-ray diffraction study of a ruthenium-containing film both before and after preferential removal of ruthenium.

FIG. 7 shows X-ray diffraction data confirming the formation of ruthenium and ruthenium oxide phases as described in this example embodiment, with preferential removal of ruthenium. Deposited $RuO_x$ films were wet etched in CR14, a well-known commercially available wet etchant comprising ceric ammonium nitrate and acetic acid. Some films were annealed in non-oxidizing ambients (for example, $N_2$, $NH_3$, He, Ar) prior to the wet etch. SEM examination of annealed films wet-etched in CR14 for 30 seconds showed pitting of the films consistent with preferential etching of ruthenium, leaving ruthenium oxide, while non-annealed films showed less evidence of selective etching. X-ray diffraction studies confirmed the presence of ruthenium and ruthenium oxide in the pre-etch annealed films, and the absence of ruthenium in the post-etch films. FIG. 7 shows the pre-etch and post-etch X-ray diffraction data, with ruthenium peaks present in a pre-etch trace 701 but absent in a post-etch trace 703.

The invention above is described in detail by means of a specific example embodiment, but is not limited thereto. Furthermore, variations within the scope and spirit of the invention discussed above will be apparent to those of skill in the art. For example, in addition to the first layer, the dielectric layer and the overlaying conductive layer may be proximate to one another, with other intervening layers, although in the desirable approach, these layers abut one another, and layers 24 and 26 need not be homogeneous as they may be formed of multiple layers or materials. The invention is accordingly defined not by the particular embodiments and variations explicitly described, but by the claims below.

We claim:

1. A method of forming a conductive structure, comprising:

forming a layer of electrically conductive material;

forming a layer of non-stoichiometric ruthenium oxide on the layer of conductive material;

annealing the layer of non-stoichiometric ruthenium oxide to form ruthenium and ruthenium oxide phases; and differentially removing the ruthenium phase relative to the ruthenium oxide phase.

2. The method of claim 1, wherein the non-stoichiometric ruthenium oxide layer is oxygen-deficient.

3. A method of forming a conductive structure, the method comprising:

depositing a layer of oxygen-deficient non-stoichiometric ruthenium oxide;

annealing the deposited layer for a time and at a temperature sufficient to cause at least some separation of ruthenium and ruthenium oxide phases within the layer; and removing ruthenium preferentially over ruthenium oxide from the layer.

4. The method of claim 3, wherein the act of annealing comprises forming zones of ruthenium phase material within the layer with at least some of the zones extending through an entire thickness of the layer.

5. The method of claim 3, wherein the act of annealing comprise forming zones of ruthenium phase material within the layer, wherein a mean diameter of such zones is in the range of about one to about three times a thickness of the layer.

6. A method of forming a conductive structure, the method comprising:

forming a layer of oxygen-deficient ruthenium oxide on the layer of conductive material;

annealing the layer of oxygen-deficient ruthenium oxide to form ruthenium and ruthenium oxide phases; and differentially removing the ruthenium relative to the ruthenium oxide.

7. The method of claim 6, wherein the act of forming a layer of oxygen-deficient ruthenium oxide comprises depositing a layer of ruthenium oxide.

8. The method of claim 6, wherein the act of differentially removing comprises preferentially etching a ruthenium phase in a layer of oxygen-deficient ruthenium oxide and ruthenium.

9. A method of forming an enhanced-surface-area conductive structure, the method comprising:

forming a layer of electrically conductive material;

forming a layer of oxygen-deficient ruthenium oxide on the layer of the conductive material;

annealing the layer of oxygen-deficient ruthenium oxide to form a layer that includes ruthenium and ruthenium oxide phases; and differentially removing the ruthenium relative to the ruthenium oxide so as to form ruthenium zones that extend substantially through the thickness of the layer of ruthenium and ruthenium oxide phases, wherein the ruthenium zones have widths of between about one to three times a thickness of the layer of ruthenium and ruthenium oxide phases.

10. A method of forming an enhanced-surface-area conductive structure, the method comprising:

forming a layer of electrically conductive material;

forming a layer of oxygen-deficient ruthenium oxide on the layer of the conductive material;

annealing the layer of oxygen-deficient ruthenium oxide to form a layer that includes ruthenium and ruthenium oxide phases; and differentially removing the ruthenium relative to the ruthenium oxide so as to form ruthenium oxide pits having a diameter of between about one to three times the thickness of the layer of ruthenium and ruthenium oxide phases.

11. A method of forming a conductive structure, the method comprising:

forming a layer of electrically conductive material;

forming a layer of non-stoichiometric ruthenium oxide on the layer of conductive material;

annealing the layer of non-stoichiometric ruthenium oxide to form ruthenium and ruthenium oxide phases; and roughening the layer by differentially removing the ruthenium phase relative to the ruthenium oxide phase.

12. A method of forming a conductive structure, the method comprising:

depositing a layer of oxygen-deficient non-stoichiometric ruthenium oxide;

annealing the deposited layer for a time and at a temperature sufficient to cause at least some separation of ruthenium and ruthenium oxide phases within the layer; and roughening the layer by removing ruthenium preferentially over ruthenium oxide from the layer.

13. A method of forming a conductive structure, the method comprising:

forming a layer of electrically conductive material;

forming a layer of oxygen-deficient ruthenium oxide on the layer of conductive material;

annealing the layer of oxygen-deficient ruthenium oxide to form ruthenium and ruthenium oxide phases; and roughening the layer by differentially removing the ruthenium relative to the ruthenium oxide.

\* \* \* \* \*